(12) United States Patent
Hickerson et al.

(10) Patent No.: US 7,906,750 B2
(45) Date of Patent: Mar. 15, 2011

(54) HELIOSTAT WITH INTEGRATED IMAGE-BASED TRACKING CONTROLLER

(75) Inventors: Kevin Hickerson, Altadena, CA (US); Dan Reznik, New York, NY (US)

(73) Assignee: Esolar, Inc., Burbank, CA (US)

( * ) Notice: Subject to any disclaimer, the term of this patent is extended or adjusted under 35 U.S.C. 154(b) by 336 days.

(21) Appl. No.: 12/058,110

(22) Filed: Mar. 28, 2008

(65) Prior Publication Data

US 2008/0236568 A1    Oct. 2, 2008

Related U.S. Application Data

(60) Provisional application No. 60/921,227, filed on Mar. 30, 2007.

(51) Int. Cl.
*G01C 21/02* (2006.01)
(52) U.S. Cl. .................. 250/203.4; 250/203.1
(58) Field of Classification Search .... 250/203.1–203.4, 250/205, 208.1; 126/573–578, 600–606
See application file for complete search history.

(56) References Cited

U.S. PATENT DOCUMENTS

| | | | |
|---|---|---|---|
| 4,136,673 A | 1/1979 | Escher | |
| 4,332,240 A | 6/1982 | Ward | |
| 4,564,275 A | 1/1986 | Stone | |
| 4,586,488 A * | 5/1986 | Noto | ............................. 126/578 |
| 5,861,947 A | 1/1999 | Neumann | |
| 6,392,687 B1 | 5/2002 | Driscoll, Jr. et al. | |
| 2004/0231660 A1 | 11/2004 | Nakamura | |
| 2006/0201498 A1 | 9/2006 | Olsson et al. | |
| 2009/0249787 A1 | 10/2009 | Pfahl et al. | |

FOREIGN PATENT DOCUMENTS

| | | |
|---|---|---|
| DE | 10 2006 053 758 A1 | 5/2008 |
| WO | WO 2008/058866 A1 | 5/2008 |

OTHER PUBLICATIONS

International Search Report, Serial No. PCT/US2008/04077 dated Jul. 26, 2008.

* cited by examiner

*Primary Examiner* — Que T Le
(74) *Attorney, Agent, or Firm* — Michael Blaine Brooks, P.C.; Andrew Naglestad

(57) ABSTRACT

A system (100) for directing incident sun light to a receiver (150) based on an integral imager (116) is disclosed. The system includes an imager (116) mounted to a reflector (112); a tracking controller (226) coupled to the imager; and one or more actuators (114) connected to the reflector and tracking controller. The tracking controller (226) is configured to receive and process image data from the imager (116); determine angular positions of a radiation source and target relative to the mirror normal vector (N) based on the image data; and orient the reflector with the axis bisecting the angular positions of the sun and receiver (150). When the optical axis of the imager is precisely aligned with the vector normal to the reflector, the source and target will be detected as antipodal spots (320, 330) with respect to the center of the imager's field of view, which may be used to effectively track the sun or like object.

21 Claims, 5 Drawing Sheets

HELIOSTAT WITH INTEGRATED IMAGE-BASED TRACKING CONTROLLER

CROSS-REFERENCE TO RELATED APPLICATION(S)

This application claims the benefit of U.S. Provisional Patent Application Ser. No. 60/921,227 filed Mar. 30, 2007, entitled "Method and apparatus for calibration and tracking of a heliostat using a pin-hole imager," which is hereby incorporated by reference herein for all purposes.

TECHNICAL FIELD

The invention generally relates to a technique for configuring a heliostat to track the sun. In particular, the invention relates to a system and method using a two dimensional imager integrally mounted on the heliostat to aim a mirror or other optical element so as to direct reflected light to a receiver.

BACKGROUND

In some solar thermal power plants, numerous heliostats may be employed to reflect light onto a receiver. The mirrors of each of the heliostats must be continually repositioned in order to account for the movement of the sun. Tracking errors must be exceedingly small in large power plants to achieve high concentration at the receiver aperture. When the heliostats are installed, however, the precision with which the location and orientation of the heliostats is known is generally insufficient to accurately reflect light to the receiver. A calibration phase is then necessary to generate better estimates of the position and orientation variables.

For calibration, power plants generally use one of several systems: a white screen located near the receiver aperture with one or more cameras pointed at the receiver, or multiple cameras located near the aperture looking onto the heliostats. In the first system, each heliostat redirects light to one or more white screens located in the vicinity of the receiver. An external camera is used to locate the reflected light of said heliostat and determine the alignment error based upon the difference between expected and measured positions. Only a small number of heliostats can be calibrated at a time since their reflected images are projected onto the same white screen. Disadvantages of this system include (a) too long a calibration time since a large number of mirrors must be calibrated serially; (b) incomplete characterization of the heliostat pose since the error signal is essentially on the receiver plane, (c) dependence on centralized control and connectivity with the latter, (d) open-loop operation after calibration which is not robust with respect to shifts in heliostats' base coordinates and orientation (e.g., due to land shifts, earthquakes, etc).

In a second prior art system, multiple cameras mounted near the receiver control the heliostat in closed-loop. In one implementation, four cameras are positioned at the receiver, one to the right, above, left, and below the receiver aperture. Each camera is pointed at the heliostat field; since the optics of each camera is close enough to a pinhole, distinct heliostats pointed at a given camera will be imaged as a distinct bright spot in the camera plane. Thus several heliostats can be imaged in parallel, overcoming the serial limitation of the white-screen based prior art. Heliostats can thus be aimed in closed-loop, namely, the cameras can guide a given heliostat to aim at the receiver aperture exactly between them. This system, however, poses several practical difficulties. First, the surrounding cameras must lie exceedingly close to the receiver aperture, thus increasing the chance of damage to the cameras if exposed to concentrated flux. Second, each camera must be able to image the entire field (requiring very large field of view) and resolve all heliostats (requiring very fine resolution), which is especially difficult for fields with a very large number of small heliostats.

There is therefore a need for a cost-effective, practical, sensor-robust, and decentralized heliostat tracking system that permits each of a large array of heliostats to accurately reflect sunlight to the receiver, especially where the heliostat mirrors are densely populated and at large distances from the receiver.

SUMMARY

The invention in one embodiment features a system for directing incident radiation from a source to a target. The system includes a reflector for reflecting the incident radiation; an imager connected to the reflector, the imager having an aperture (such as a pinhole or lens) and an imaging plane; a tracking controller coupled to the imager; and one or more actuators connected to the reflector and tracking controller. The tracking controller is configured to receive image data from the imager; determine angular positions of a radiation source and target relative to the reflector based on the image data; and orient the reflector with its axis bisecting the angular positions of the radiation source and target. The reflector may be a mirror that redirects sunlight to a receiver based on image data from a pinhole camera or other digital imager. In general, the optical axis of the camera is substantially aligned with the vector normal to the reflective surface so that the sun and the receiver appear at antipodal points with respect to the center of the camera's field of view. To increase tracking accuracy, however, the tracking controller in some embodiments orients the mirror based on a calibrated reference point that compensates for the deviation between the mirror normal vector and the optical axis of the camera. In this configuration, the mirror normal substantially bisects the receiver and sun direction vectors with the receiver and sun presenting at substantially antipodal positions with respect to the calibrated reference point. By orienting the mirror to maintain the antipodal relationship of the sun and receiver, the heliostat can effectively track the sun using a simple tracking algorithm. Because each heliostat measures the angular location of the sun and receiver on its own, each heliostat can independently execute tracking operations with its own embedded tracking controller. This obviates the need for a central controller coordinating a plurality of heliostats typical of the prior art described above In some embodiments, the invention comprises a method of tracking the sun with a heliostat, the heliostat including an imager mounted to a mirror. The method includes: calibrating the imager by compensating for the inherent mis-aligning the imager's optical axis with the mirror normal vector; capturing an image including the sun and a receiver with the imager; locating image points corresponding to the sun and receiver in the captured image; actuating the mirror to align the mirror to an orientation in which its calibrated reference point is between the antipodal points corresponding to the sun and receiver in the captured image, which effectively orients the mirror at an angle bisecting the angle between position vectors for the sun and receiver in a heliostat-centered coordinate system.

BRIEF DESCRIPTION OF THE DRAWINGS

The present invention is illustrated by way of example and not limitation in the figures of the accompanying drawings, and in which.

DETAILED DESCRIPTION OF THE PREFERRED EMBODIMENT

Figure 1:
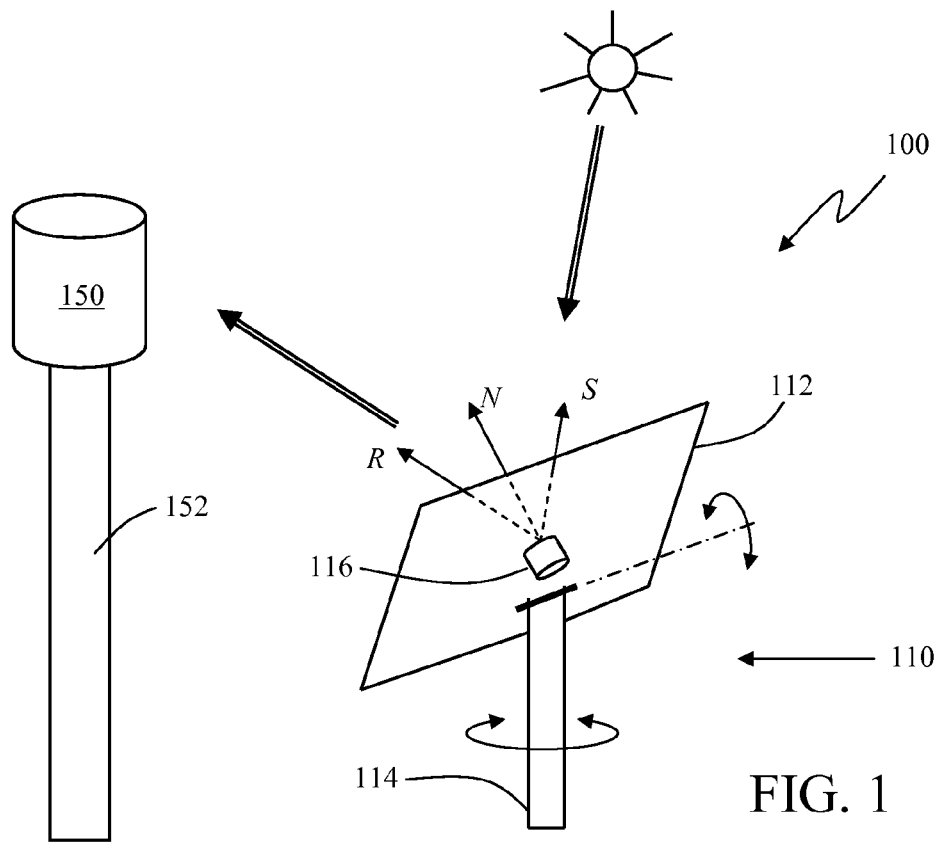
FIG. 1 is a diagrammatic illustration of one of a plurality of heliostats and a receiver for collecting and converting solar energy, in accordance with one exemplary embodiment.

Illustrated in FIG. 1 is a diagrammatic representation of one of a plurality of heliostats and a receiver for collecting and converting solar energy in what may be referred to as a solar power plant (thermal or electric depending on the type of receiver). The heliostat 100 is configured to track the sun over the course of a day and directed the incident light to the receiver 150 where it is generally converted to electricity. The heliostat includes a mirror 112, actuator assembly 114 for changing the orientation of the mirror, and tracking controller to determine the appropriate direction to aim the mirror. Throughout the day, the orientation of each mirror is periodically adjusted about two degrees of freedom (e.g., azimuth angle and elevation angle, or two tilt angles, etc) to continually direct the reflected light to the receiver 150 with a high degree of precision. The heliostat is preferably one of a plurality of heliostats distributed in proximity to a tower 152 or other structure on which the receiver 150 is mounted. The receiver 150 may include a boiler for turning a steam turbine, a molten salt system, a heat engine, one or more photovoltaic cells, a biomass cooker, a water purification system, or a combination thereof for generating electricity or otherwise collecting the sun's energy.

The heliostat 110 tracks the sun or other radiation source based on image data received from a two-dimensional imager 116, e.g., a digital camera, rigidly attached or otherwise integrally incorporated into the mirror of the heliostat. The camera 116 captures an image of the sun and receiver which is then transferred to a tracking controller. The tracking controller determines the locations of the sun and receiver based on the image data (e.g., by locating bright spots), then aims the mirror in the direction necessary to reflect incident light to the receiver or other target. To accomplish this, the controller moves the mirror to an orientation where two detected bright spots corresponding to the sun and receiver appear as substantially antipodal points with respect to a calibrated reference point in the imager's field of view. This reference point—which corresponds to the projection of the mirror normal vector onto the imager at the aperture—represents the deviation between the imager's optical axis and the mirror normal vector. As the sun moves across the sky, the camera detects the shift in sun position and drives the actuator system until the antipodal relationship with respect to the calibrated reference point is restored, thereby providing a closed loop tracking system. Although the sun and receiver appear precisely antipodal if the normal to the imager plane coincides with the mirror normal, one skilled in the art will appreciate that it may be necessary to correct for any angular offset between the normal to the imager plane N' and the mirror normal N which causes the calibrated reference point to shift away from the midpoint between the sun and receiver bright spots even when the mirror normal exactly bisects the angle between incident sunlight vector S and receiver vector R.

Figure 2:
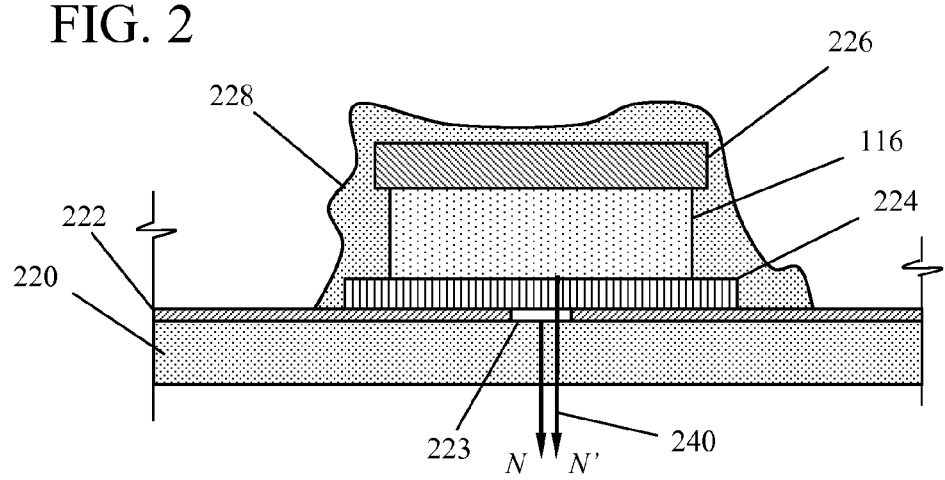
FIG. 2 is a cross sectional view of a heliostat mirror with integral imager, in accordance with one exemplary embodiment.

A cross sectional view of the exemplary camera-based tracking system is illustrated in FIG. 2. The tracking system includes the imager 116, e.g., a narrow aperture CMOS camera optically mounted to the back of the mirror 220 where it faces outward in a direction between the source and target. The camera-based tracking system may further include integrated control logic, i.e., a tracking controller 226, for computing the tracking error and driving the actuator assembly that orients the mirror. The imager 116 preferably has a view of the source and target by means of a small aperture 223 in the mirror to admit light. The aperture 223 may be an actual opening or a section of glass where the reflective metallization 222 has been removed by laser etching or machining, for example. In some embodiments, a thin filter plate 224 is mounted between the mirror 220 and camera 116 to suppress the lateral spread of light and increase source/target image resolution. In other embodiments, the camera is mounted to an edge of the mirror, on the front face of the mirror, or cantilevered off to the side of the mirror, for example. A suitable imager is a ⅙ inch format CIF (352×288) or VGA (640×480), preferably small enough that it does not need a large filter plate. The resolution of the imager need only be high enough so that the two spot centers can be localized accurately enough to allow the control logic to determine a smooth path on which to actuate the mirror.

During assembly of the heliostat 100 before final assembly of the imager 116 on the mirror 220, the imager is positioned on the mirror by (a) aligning the optical axis of the camera—represented by normal vector 240—to the mirror's normal vector perpendicular to the mirror plane, and (b) aligning the optical axis of the camera with the center of the pinhole aperture. The optical axis of the camera need not be precisely aligned with the mirror normal vector since the deviation there between may be determined and compensated using the calibration process discussed herein. After proper placement of the imager 116, the imager and tracking controller 226 may be encapsulated with epoxy 228, potting compound, or other sealant to hermetically seal the electronics and camera behind the mirror, thereby protecting them from environmental damage. The aperture may be filled with an optical coupling agent to prevent an air gap from occurring between the mirror glass 220 and filter plate 224. Before normal operation of the heliostat, the precise position and orientation of the imager with respect to the mirror is determined and the calibrated reference point uploaded to non-volatile memory in the tracking controller.

During heliostat tracking operations, the camera 116 captures an image of the sun and receiver while the tracking controller 226 estimates the angular location of the sun and the receiver 150 at the same time. The sun and receiver are generally identified as the brightest sources of light in the image. Although the receiver 150 may be as bright or nearly as bright as the sun when fully illuminated by a field of heliostats, the receiver may appear relatively dark until it receives sufficient flux. In a low-flux situation, the receiver may be identified by means of an active light source on the receiver 150, by reflection from a retro-reflector on the receiver, or by an object recognition system. Depending on the dynamic range of the imager, it may be necessary in some embodiments to reduce the incident light admitted to the imager in order to effectively determine the position of the sun. Illumination coming from the sun may be attenuated (e.g., by adaptively filtering a sector of the lens or of the imaging sensor) so as to equalize the intensity of both the sun's disc and the receiver on the imaging sensor. Alternatively, an image sensor with sufficient dynamic range may be selected which enables both the bright sun and the receiver to be detected simultaneously. Once the tracking controller 226 identifies the projected points representing the sun and receiver in the image, the controller updates the mirror's elevation and/or azimuth angles so that the sun and receiver appear reflected about the camera's calibrated reference point, thus placing the mirror in the correct position to reflect rays from the sun to the receiver. In another embodiment, two or more angular quadrants are imaged independently so that stray light does not scatter between them.

Figure 3A:
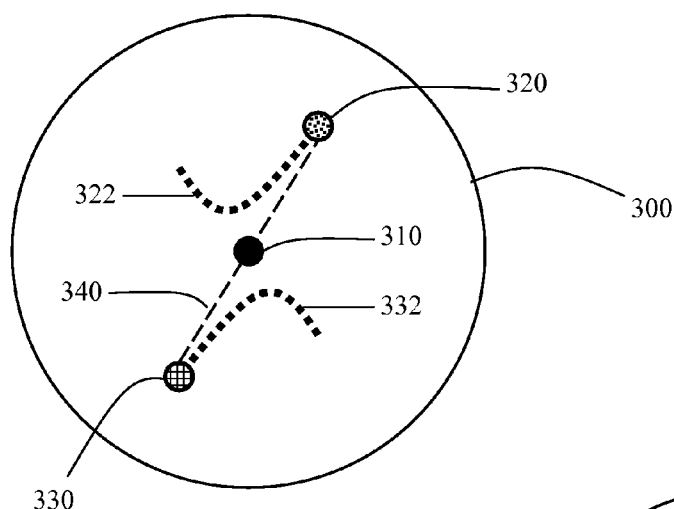
FIG. 3A is diagrammatic illustration of an image of the sun and receiver acquired by the camera when properly aligned between the sun and receiver, in accordance with one exemplary embodiment.
Figure 3B:
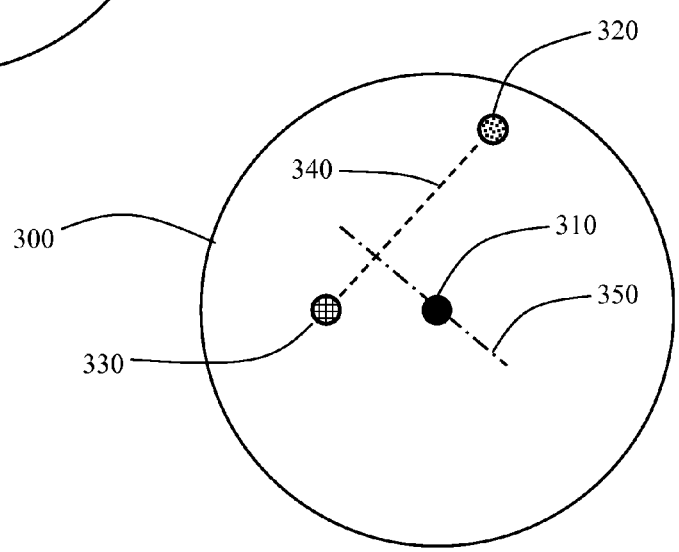
FIGS. 3B through 3C are diagrammatic illustrations of an image of the sun and receiver at various stages of misalignment of the mirror normal vector with respect to the sun and receiver, in accordance with one exemplary embodiment.
Figure 3C:
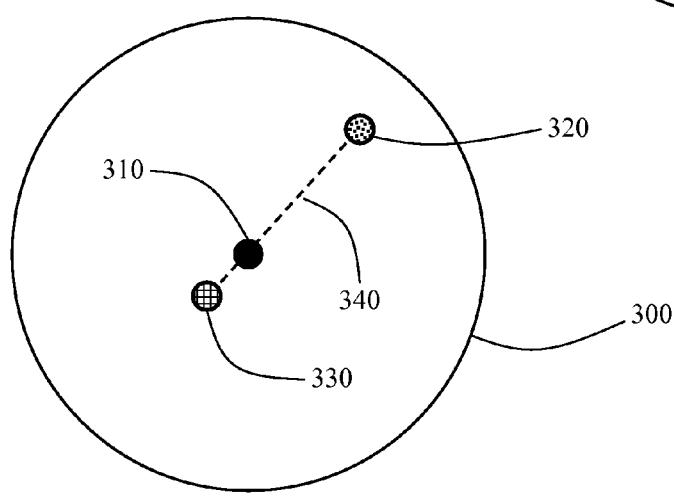

Illustrated in FIGS. 3A through 3C are diagrammatic illustrations of the image 300 of the sun and receiver acquired by the camera at various stages of tracking or misalignment. When the mirror is properly aligned as shown in FIG. 3A, the calibrated reference point 310 coincides with the mid point on the line 340 between the image of the sun 320 and receiver 330. The images of the sun and receiver are therefore located substantially antipodal around the calibrated reference point. Over the course of the day, the image of the sun and receiver trace out paths 322, 332 that are also antipodal provided the mirror is properly aligned.

In contrast, when the mirror is improperly aligned, the calibrated reference point 310 of the camera is either located off the line 340 between the sun and receiver as shown in FIG. 3B or the calibrated reference point 310 of the camera is not equidistant between the sun 320 and receiver 330 as shown in FIG. 3C. To reorient the mirror to the proper alignment, the mirror may be actuated about the two axes of rotation separately or concurrently.

During assembly of a heliostat 100, a pick-and-place machine may be used to locate the imager 116 on the mirror 220. Even a high precision manufacturing process can result in a small deviation between the imager and mirror. Although small, the difference between the orientation of the imager and mirror can hamper the ability of the heliostat to effectively redirect sunlight to a receiver with the required angular accuracy. The calibration procedure described herein may be used to determine the precise difference between the imager's optical axis and the mirror's normal as well as the optical center of the imager and the optical center of the pinhole, lens system or aperture, thereby providing the correction needed to precisely locate the source and target from the image data acquired by the camera 116.

Figure 4:
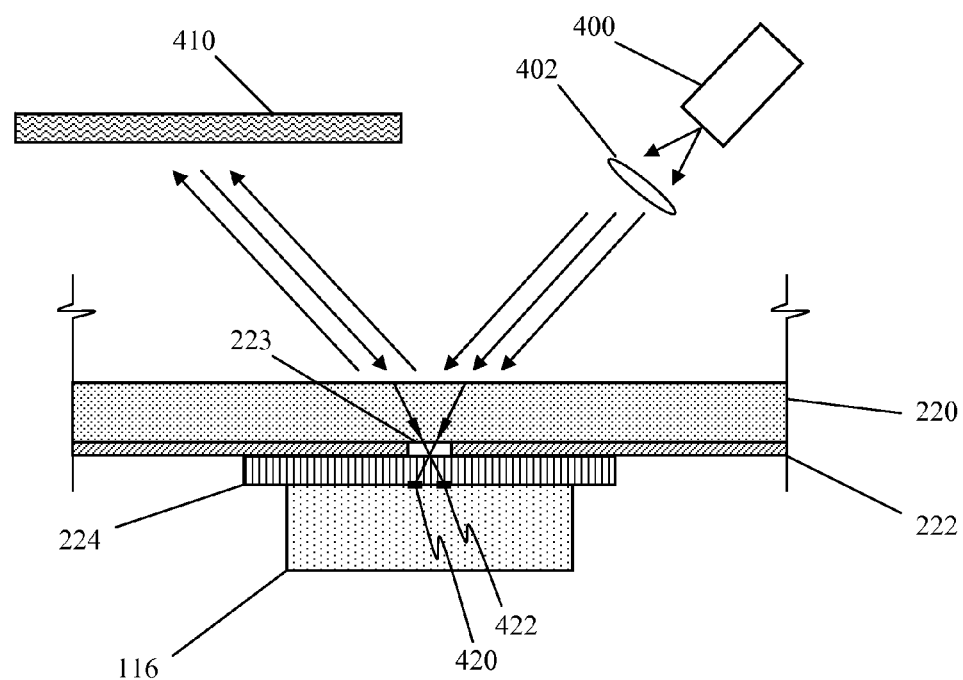
FIG. 4 is a diagrammatic illustration of the calibration setup used to precisely determine the optical center of the imager on a mirror backing, in accordance with one exemplary embodiment.
Figure 5:
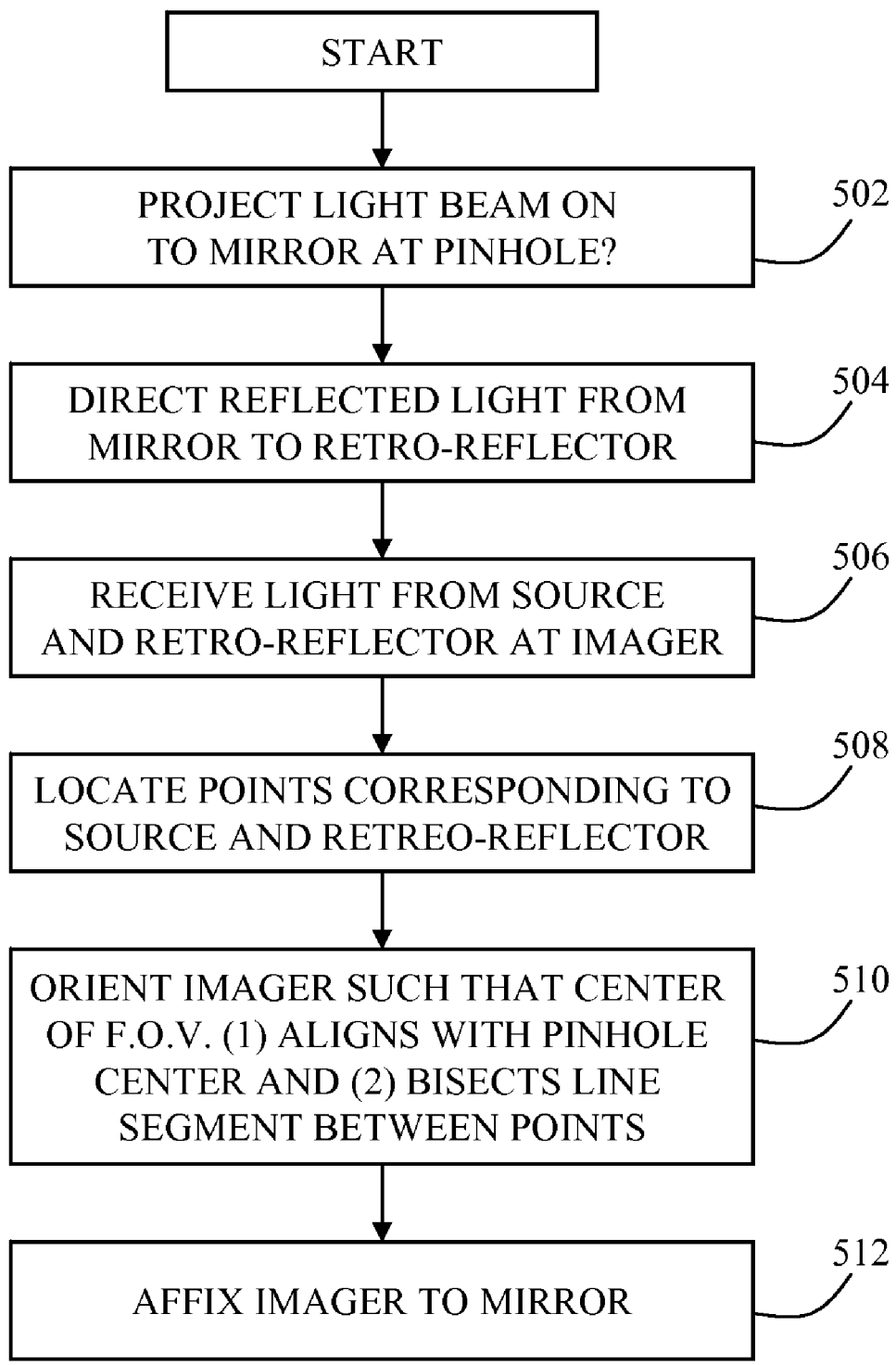
FIG. 5 is an exemplary method of determining the position and orientation of the imager with respect to the mirror using a laser and retro-reflector, in accordance with one exemplary embodiment.

Illustrated in FIG. 4 is a calibration setup and in FIG. 5 is a calibration method for precisely determining the orientation and position of the imager 1160 with respect to the mirror 220 using a laser 400 and retro-reflector 410. The determined orientation can then be used to calibrate the tracking controller for purposes of precisely calculating the positions of the source and target, as described above. The laser or other light source, which may be coherent and monochromatic, is configured to project light which is collimated by optics 402. The collimated beam is projected 502 onto the front surface of the mirror glass 220 at the point of the pinhole 223. Some rays of light are shown into the pinhole at an angle that is altered by Snell's law down through the filter plate 224 and onto the imager where they create a first spot 420. Rays that are not admitted by the pinhole 223 are reflected 504 to a retro-reflector 410 which reflects light back in the general direction of the mirror. The rays reflected back to and captured by the pinhole 223 are substantially parallel to the rays reflected from the mirror to the retro-reflector. The angle of the light from the retro-reflector is at the same angle as the incident light but reflected about the vector normal to the mirror face. The portion of the light from the retro-reflector that is admitted by the pinholes and received 506 at the imager creates a second spot 422. The imager and tracking controller then locate 508 the first spot 420 and second spot 422 for use as simulated calibration points. The mirror normal vector corresponds to the midpoint between the first spot 420 and the second spot 422. Any deviation between the imager's optical axis and the mirror's normal vector results in a shift in the simulated midpoint away from the center of the imager's field of view. Additional calibration points may be measured and LSF, linear regression, SVD algorithm or other optimization algorithm may be used to improve the accuracy of the imager's position and orientation estimate. Depending on the number of calibration points, the effective optical axis determined by calibration—referred to herein as the "calibrated reference point"—can be determined with sub-pixel resolution. After calibration, the tracking controller is configured to orient the mirror so as to place the sun and receiver in antipodal positions with respect to the calibrated reference point.

Figure 6:
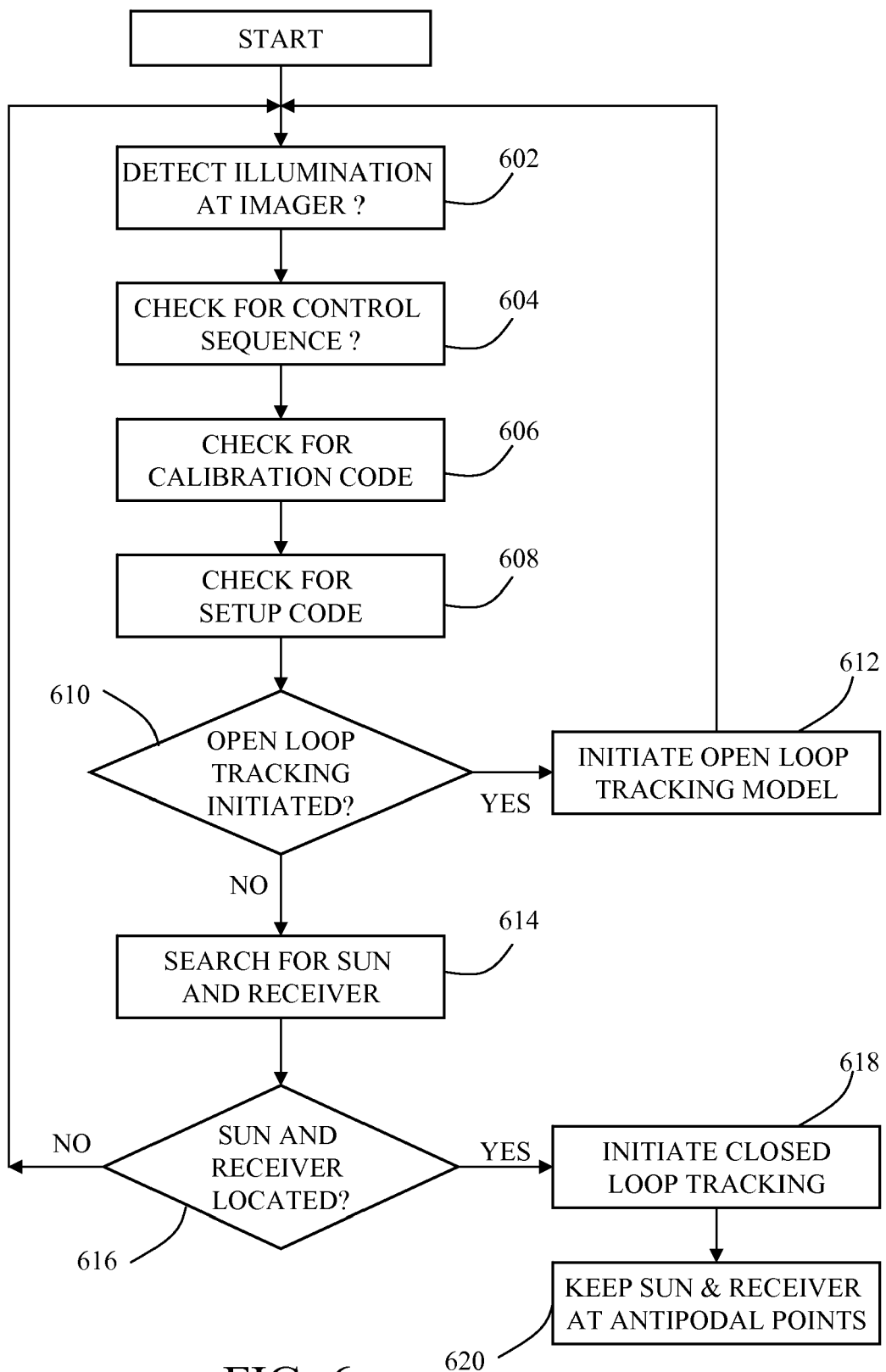
FIG. 6 is an exemplary method for tracking the sun using the imager and corresponding tracking controller, in accordance with one exemplary embodiment.

Illustrated in FIG. 6 is an exemplary method for tracking the sun using the imager and corresponding tracking controller. In the morning, the tracking controller becomes active when the imager detects 602 illumination above some predetermined threshold. The tracking controller then begins listening for (1) a control sequence 604 instructing the tracking controller as to the proper tracking mode, for example, (2) calibration code 606 instructing the tracking controller to initiate a calibration sequence in which the relative position of the mirror and receiver is precisely determined, and (3) setup code 608 instructing the tracking controller to execute one or more configuration operations before being activated. The control sequence, calibration code, setup code, or combination thereof may be transmitted to the particular tracking controller using a wired system or wireless system including radio control (RC), infrared, or optical transmission mode received via the imager or other optical device.

If the control sequence specifies an open loop tracking procedure, decision block 610 is answered in the affirmative and the tracking controller begins orienting 612 the mirror based on a model (analytic or empirical) prescribing the azimuth and elevation angles of the sun over the course of a day. If a closed-loop tracking mode is specified, decision block 610 is answered in the negative and the heliostat controller begins looking for the sun and receiver in decentralized fashion, which generally appear as two light spots in the image captured by the camera (see adaptive filtering below). If and when the sun and receiver are located, the heliostat initiates 618 a closed loop tracking operation using feedback based on the camera image to continually orient the mirror so as to maintain 620 the sun and receiver at the antipodal points about the camera's center axis, as described above in detail.

Figure 7:
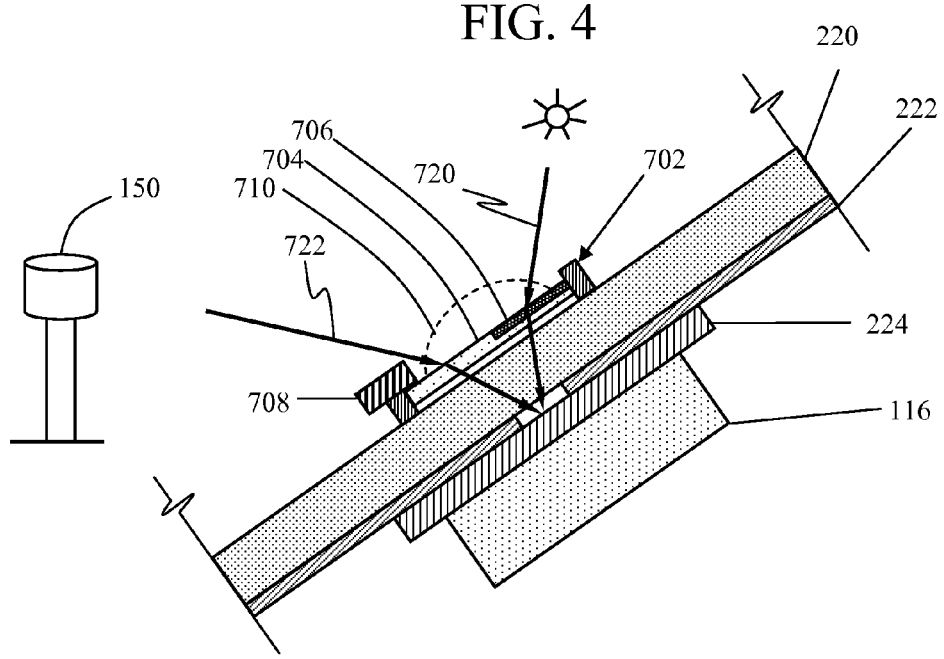
FIG. 7 is an exemplary embodiment of the heliostat including an adaptive filtering mechanism, in accordance with one exemplary embodiment.

Illustrated in FIG. 7 is an adaptive filtering mechanism (AFM) used in some an exemplary embodiments of the heliostat. The AFM 702 is mounted directly over the imager 116 and is configured to selectively attenuate light from the brighter light source, i.e., the sun (to prevent pixel "bleeding"), while admitting as much light as possible from the receiver 150. The effective dynamic range of the imager is improved when the difference in light intensity is reduced, thereby increasing the chance of the tracking controller identifying the receiver even on the sunniest of days.

In the embodiment shown in FIG. 7, the AFM 702 includes a visible light filter 706 that is offset from the pinhole aperture, or shaped to cover about half of the pinhole aperture while allowing light to pass through the other half. A suitable filter 706 may be, for example, a 62-mm 0.4 neutral density filter with a 1-inch 3.0 neutral density filter. The visible light filter 706 is affixed to a transparent backing plate 704 that freely admits light from the receiver. 150 To account for the movement of the sun, the AFM 702 further includes a stepper motor 708 or other actuator to rotate the visible light filter 706 and backing plate 704 in the plane parallel to the face of the mirror 220, thereby insuring that the filter is continually interposed between the sun and imager 116. In other embodiments, the visible light filter 706 includes a heat-resistant liquid crystal display (LCD) with a plurality of pixels that can be selectively activated to attenuate direct sunlight prior to the imager 116 while admitting light needed to resolve the location of the receiver 150 or other calibration point. The opacity of different pixels of the LCD can be dynamically updated during the day, thereby avoiding the need to rotate the LCD. In yet another embodiment, the adaptive filtering might occur by selecting the sensitivity of specific sections of the imaging sensor, for example, each quadrant. Equivalently, an array of image sensors can be juxtaposed to form one full-size image sensor, with each said sensor allowing for an independent sensitivity control. Typically, sun and receiver will be imaged on antipodal quadrants of the array; sensors in the former quadrant will be assigned a much lower light sensitivity than those in the latter.

In some embodiments, the heliostat may further include a fisheye lens 710, Fresnel lens, or solid convergent lens mounted over the mirror 220, preferably over the AFM 702, to increase the field of the imager 116. As one skilled in the art will appreciate, the image can continuously track the sun without the need to first remove image distortion induced by the lens. With the imager properly calibrated with respect to the mirror, the distortion induced by the lens with respect to the position of the receiver is equal and opposite to the distortion in the position of the sun when the receiver and sun are at antipodal positions.

Although the description above contains many specifications, these should not be construed as limiting the scope of the invention but as merely providing illustrations of some of the presently preferred embodiments of this invention.

Therefore, the invention has been disclosed by way of example and not limitation, and reference should be made to the following claims to determine the scope of the present invention.

We claim:

1. A system for directing incident radiation from a source to a target, the system comprising:
 a reflector for reflecting the incident radiation, the reflector having an optical axis;
 an imager connected to the reflector;
 a tracking controller coupled to the imager; and
 one or more actuators connected to the reflector and tracking controller;
 wherein the tracking controller is configured to:
   i) receive image data from the imager;
   ii) detect both source and target projections based on the image data; and
   iii) actuate the reflector so its axis bisects the angular positions of the radiation source and target.

2. The system in claim 1, wherein the reflector is a mirror.

3. The system in claim 2, wherein the imager is a digital camera.

4. The system in claim 3, wherein the digital camera is a narrow-aperture camera.

5. The system in claim 4, wherein the camera is mounted to the non-reflective side of the mirror in alignment with an aperture.

6. The system in claim 1, wherein the tracking controller is further configured to determine the positions of the source and target with respect to a calibrated reference point based on the image data, wherein the calibrated reference point corresponds to reflector axis.

7. The system in claim 6, wherein the optical axis of the mirror is does not coincide with an imager optical axis.

8. The system in claim 7, wherein the calibrated reference point does not coincide with a center of the field of view of the imager.

9. The system of claim 1, further comprising a filter plate interposed between the reflector and the imager.

10. The system of claim 9, wherein the filter plate, imager, and tracking controller are encapsulated on the mirror.

11. The system of claim 1, further comprising a wide-angle lens coupled to the imager.

12. The system of claim 1, further comprising an adaptive filtering mechanism for selectively attenuating radiation from the sun.

13. The system of claim 12, wherein the adaptive filtering mechanism is configured to move to compensate for movement of the sun, target, or combination thereof.

14. A heliostat for directing incident light to a receiver, the heliostat comprising:
 a mirror for reflecting the incident light, the mirror having an optical axis substantially perpendicular to the mirror;
 an imager mounted to the mirror; and
 a tracking controller coupled to the imager; and
 one or more actuators connected to the tracking controller;
 wherein the tracking controller is configured to:
   i) locate image points corresponding to the sun and receiver based on image data from the imager; and
   ii) orient the optical axis of the mirror in a direction directly between the image points corresponding to the sun and receiver based on the image data from the imager.

15. The heliostat of claim 14, wherein the tracking controller is configured to receive tracking instructions by optical communication link.

16. The heliostat of claim 14, further comprising a wireless communication device for receiving tracking instructions.

17. The heliostat of claim 15, wherein the tracking instructions comprise open-loop tracking instructions and closed-loop tracking instructions.

18. The heliostat of claim 14, wherein the optical axis of the mirror is different than an optical axis of the imager, wherein the optical axis of the mirror corresponds to a calibrated reference point.

19. A method of tracking the sun with a heliostat comprising an imager mounted to a mirror, the method comprising:
 aligning an optical axis of the imager with a vector normal to the mirror;

capturing an image including the sun and a receiver with the imager;

locating image points corresponding to the sun and receiver in the captured image;

actuating the mirror toward an orientation at which the vector normal to the mirror is between the points corresponding to the sun and receiver in the captured image, i.e., said points appear substantially antipodal respective to the vector normal to the mirror;

whereby the vector normal to the mirror is oriented at an angle bisecting a sun vector and receiver vector.

20. The method of claim 19, further comprising:
calibrating a position and orientation of the imager to determine a calibrated reference point not aligned with an optical axis of the imager.

21. The method of claim 20, wherein actuating the mirror further comprises orienting the mirror so that the receiver and sun are at substantially antipodal points with respect to the calibrated reference point to compensate for misalignment between the optical axis of the imager and the vector normal to the mirror.

* * * * *